United States Patent
Hong et al.

(10) Patent No.: US 12,199,152 B2
(45) Date of Patent: Jan. 14, 2025

(54) SELECTIVE SINGLE DIFFUSION/ELECTRICAL BARRIER

(71) Applicant: Samsung Electronics Co., Ltd., Suwon-si (KR)

(72) Inventors: Byounghak Hong, Albany, NY (US); Seunghyun Song, Albany, NY (US); Kang-ill Seo, Albany, NY (US); Daewon Ha, Hwaseong-si (KR); Jason Martineau, Milpitas, CA (US)

(73) Assignee: Samsung Electronics Co., Ltd., Yongin-si (KR)

( * ) Notice: Subject to any disclaimer, the term of this patent is extended or adjusted under 35 U.S.C. 154(b) by 310 days.

(21) Appl. No.: 17/325,083

(22) Filed: May 19, 2021

(65) Prior Publication Data

US 2022/0231134 A1   Jul. 21, 2022

Related U.S. Application Data

(60) Provisional application No. 63/174,830, filed on Apr. 14, 2021, provisional application No. 63/138,594, filed on Jan. 18, 2021.

(51) Int. Cl.
| | | |
|---|---|---|
| H01L 27/092 | (2006.01) | |
| H01L 21/8238 | (2006.01) | |
| H01L 29/40 | (2006.01) | |
| H01L 29/49 | (2006.01) | |

(52) U.S. Cl.
CPC .... *H01L 29/402* (2013.01); *H01L 21/823842* (2013.01); *H01L 27/092* (2013.01); *H01L 29/401* (2013.01); *H01L 29/4916* (2013.01); *H01L 29/495* (2013.01); *H01L 29/4966* (2013.01)

(58) Field of Classification Search
CPC .......... H01L 29/495; H01L 21/823828; H01L 21/823842; H01L 2027/11866; H01L 27/09
See application file for complete search history.

(56) References Cited

U.S. PATENT DOCUMENTS

| | | |
|---|---|---|
| 8,395,191 B2 | 3/2013 | Or-Bach et al. |
| 8,541,819 B1 | 9/2013 | Or-Bach et al. |
| 8,664,042 B2 | 3/2014 | Or-Bach et al. |
| 9,985,029 B2 | 5/2018 | Andrieu |

(Continued)

FOREIGN PATENT DOCUMENTS

WO    WO 2020/255655 A1    12/2020

OTHER PUBLICATIONS

EPO Extended European Search Report dated Jun. 2, 2022, issued in corresponding European Patent Application No. 22151311.2 (17 pages).

(Continued)

*Primary Examiner* — Tucker J Wright
(74) *Attorney, Agent, or Firm* — Lewis Roca Rothgerber Christie LLP

(57) ABSTRACT

Presented are structures and methods for forming such structures that allow for electrical or diffusion breaks between transistors of one level of a stacked transistor device, without necessarily requiring that a like electrical or diffusion break exists in another level of the stacked transistor device. Also presented, an electrical break between transistor devices may be formed by providing a channel of a first polarity with a false gate comprising a work-function metal of an opposite polarity.

8 Claims, 11 Drawing Sheets

(56) References Cited

U.S. PATENT DOCUMENTS

| | | |
|---|---|---|
| 10,396,076 B2 | 8/2019 | Jagannathan et al. |
| 10,559,594 B2 | 2/2020 | Tarakji et al. |
| 10,833,078 B2 | 11/2020 | Smith et al. |
| 10,910,435 B2 | 2/2021 | Reznicek et al. |
| 2013/0056833 A1 | 3/2013 | Takeoka |
| 2014/0264610 A1 | 9/2014 | Yang et al. |
| 2015/0129973 A1 | 5/2015 | Ji et al. |
| 2017/0033020 A1 | 2/2017 | Machkaoutsan et al. |
| 2018/0315838 A1 | 11/2018 | Morrow et al. |
| 2019/0229021 A1 | 7/2019 | Ando et al. |
| 2020/0235134 A1 | 7/2020 | Lilak et al. |
| 2020/0402984 A1 | 12/2020 | Reznicek et al. |
| 2021/0013326 A1 | 1/2021 | Gardner et al. |
| 2021/0082915 A1 | 3/2021 | Bao et al. |

OTHER PUBLICATIONS

IEEE, Advancing Technology for Humanity, International Roadmap for Devices and Systems, More Moore, 2020 Update, 37 pgs.

Elke Erben, "Working Function Setting in High-k Metal Gate Devices", Chapter 3, 2018, http://dx.doi.org/10.5772/intechopen.78335, 14 pgs.

EPO Extended European Search Report dated Sep. 5, 2022, issued in European Patent Application No. 22151311.2 (15 pages).

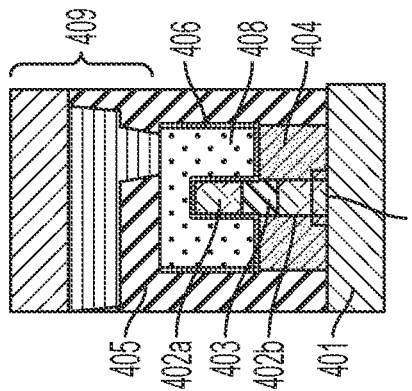
FIG. 4D
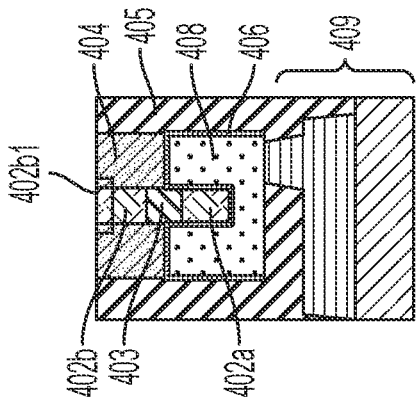
FIG. 4E
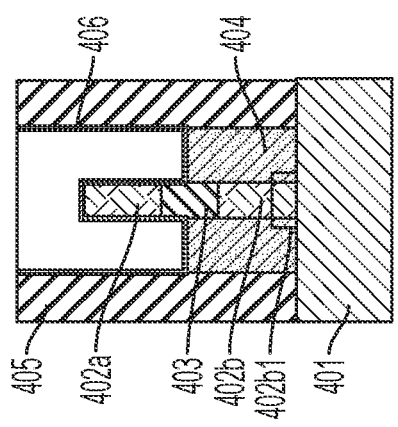
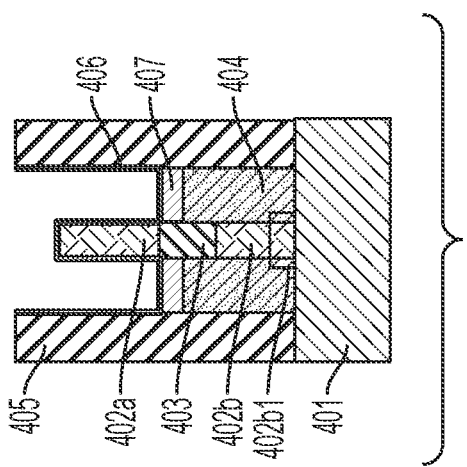
FIG. 4C
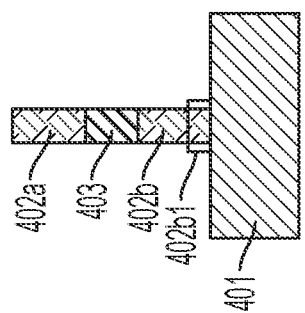
FIG. 4A
FIG. 4B

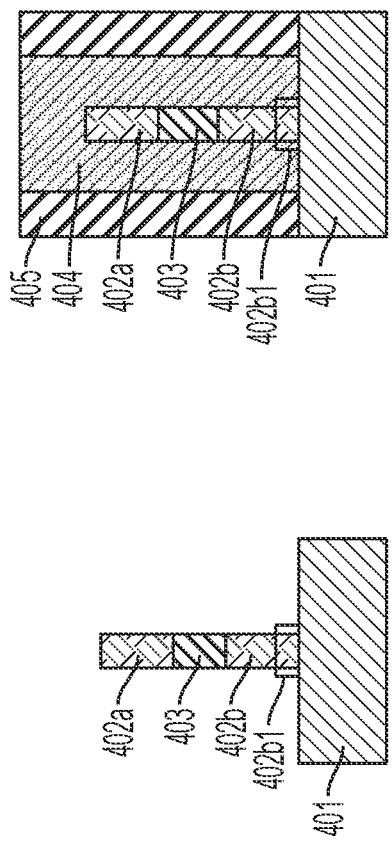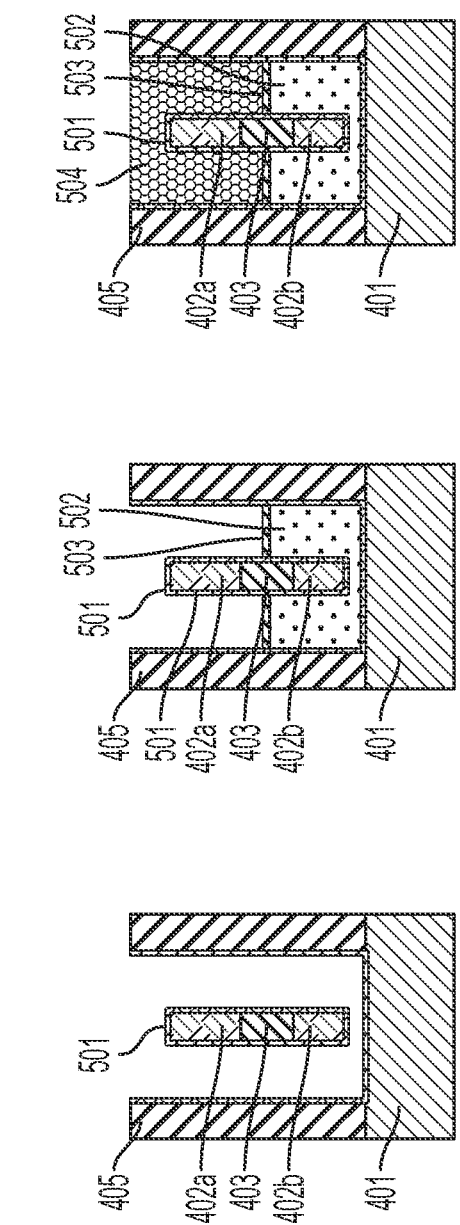

SELECTIVE SINGLE DIFFUSION/ELECTRICAL BARRIER

CROSS-REFERENCE TO RELATED APPLICATIONS

The present application claims priority to and the benefit of U.S. Provisional Application No. 63/138,594 filed Jan. 18, 2021, and to U.S. Provisional Application No. 63/174,830 filed Apr. 14, 2021, the entire content of each of which is incorporated herein by reference.

FIELD

This invention relates generally to stacked transistor structures, and more particularly to structures and methods for selectively providing electrical and diffusion breaks between stacked transistors.

BACKGROUND

This background section is intended solely to provide context for one skilled in the art to understand the inventive concepts disclosed herein. Thus, this background section may contain patentable material, and its inclusion in this section should not be viewed as an admission that the technology is pre-existing.

Diffusion breaks in semiconductor devices generally bring two distinct functionalities to a semiconductor device. First, they provide enhanced electrical isolation for adjacent transistor devices, and second, they provide a barrier against the diffusion of dopants or contaminants from one transistor to another. Diffusion breaks generally are comprised of a bulk dielectric material that fills a gap formed between transistors. This gap may be narrow, such as approximately the width of the gate (E.G, a single diffusion break, (SDB)), or wide such as the distance between adjacent features (E.G, double diffusion breaks), or more. Such diffusion breaks generally stretch, vertically, from a trench in the semiconductor substrate, all the way to the top of the transistor level.

However, difficulties may arise when constructing 3D ICs, as it may not be desirable to form a diffusion break that cuts the transistors of two or more levels.

SUMMARY

In certain aspects, some embodiments herein provide for a transistor device comprising at least two layers of transistors, wherein a first layer comprises 2 or more NFET transistor devices and a second, adjacent layer comprises 2 or more PFET transistor devices; wherein the transistor devices of the first layer are vertically aligned with the transistors of the second layer; and wherein an electrical or diffusion break resides between two or more transistors of either the first or second layer, and a gate, vertically aligned with the electrical or diffusion break, resides between two or more source-drain regions of the other of the first or second layer.

In other aspects, some embodiments herein include a method for providing an electrical break for a channel having a first polarity, comprising: providing the channel with a false gate comprising a work function metal (WFM) of an opposite polarity.

In other aspects, some embodiments herein include a method for providing a diffusion break in a level of a stacked semiconductor device, the method comprising: depositing vertically on a substrate a first active region, an isolation layer, and a second active region, depositing around the first and second active regions and the isolation layer a dummy gate, removing the a portion of the dummy gate to a vertical level of the isolation layer to create a first void, depositing a first substance in the first void, removing, from the other side of the stacked semiconductor device, the remaining portion of the dummy gate to create a second void, depositing a second substance into the second void. One of the first or second substances may comprise a dielectric material, and the other of the first or second substances may comprise a work function metal.

BRIEF DESCRIPTION OF THE DRAWINGS

FIGS. 4A-4I illustrate a method for making stacked gates according to some embodiments.

FIGS. 5A-5E illustrate an alternative method for making stacked gates according to some embodiments.

DETAILED DESCRIPTION

Figure 1:
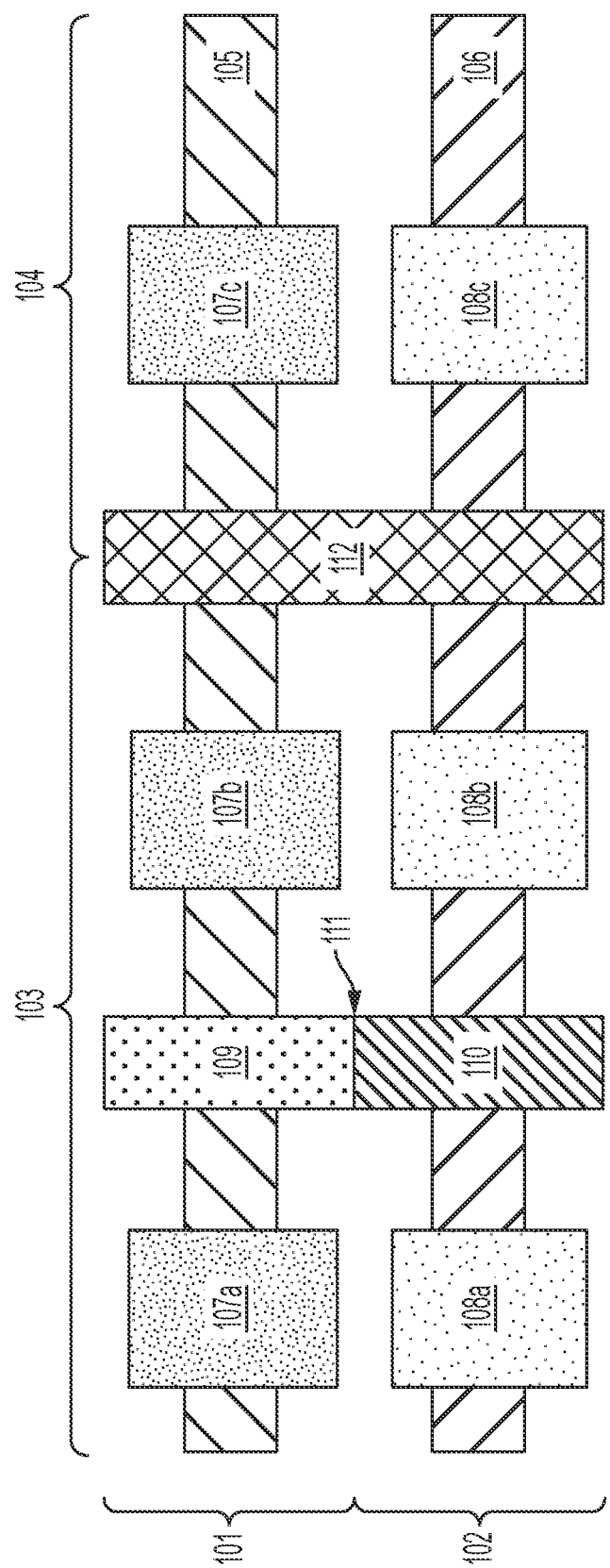
FIG. 1 provides for a stacked semiconductor device with a single diffusion break, according to some embodiments.

The example embodiments described herein are examples, and thus, the present disclosure is not limited thereto, and may be realized in various other forms. Each of the example embodiments provided in the following description is not excluded from being associated with one or more features of another example or another example embodiment also provided herein or not provided herein but consistent with the present disclosure. For example, even if matters described in a specific example or example embodiment are not described in a different example or example embodiment thereto, the matters may be understood as being related to or combined with the different example or embodiment, unless otherwise mentioned in descriptions thereof.

In addition, it should be understood that all descriptions of principles, aspects, examples, and example embodiments are intended to encompass structural and functional equivalents thereof. In addition, these equivalents should be understood as including not only currently well-known equivalents but also equivalents to be developed in the future, that is, all devices invented to perform the same functions regardless of the structures thereof.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "top," and "bottom," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms "first," "second," "third," "fourth," etc. may be used herein to describe various elements, these elements should not be limited by these terms. These terms are only used to distinguish one element from another element. Thus, a first element discussed below could be termed a second element without departing from the teachings of the present disclosure.

It will be also understood that, even if a certain step or operation of manufacturing an apparatus or structure is described later than another step or operation, the step or operation may be performed later than the other step or operation unless the other step or operation is described as being performed after the step or operation.

Example embodiments are described herein with reference to cross-sectional illustrations that are schematic illustrations of the example embodiments (and intermediate structures). As such, variations from the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosure. Further, in the drawings, the sizes and relative sizes of layers and regions may be exaggerated for clarity.

For the sake of brevity, general elements to semiconductor devices may or may not be described in detail herein.

FIG. 1 illustrates an example stacked semiconductor device, according to some embodiments, viewed from the side. The stacked semiconductor device may comprise two or more levels of transistor devices 101 and 102 above a substrate (not shown)—only two levels are shown for simplicity. Each level may comprise numerous transistors devices 103 and 104; 103 shows two stacked transistor devices on the left, one on each level 101 and 102. 104 partially shows two transistor devices, one on level 101, the other on level 102. Many more transistor devices may be present.

Accordingly, each level may comprise channel regions, 105 and 106. The channel regions may be vertically aligned and parallel between the levels, in some embodiments. The channel regions 105 and 106 may be given opposite polarities to better provide for a CMOS architecture. For example the channel region 105 may be N type (to allow for an NFET device), and channel region 106 may be P type (to provide for a PFET device). The types may also be reversed (EG, 105 may be P, and 106 may be N). However, for the sake ease of discussion, herein below assume that channel region 106 is P type, and channel region 105 is N type. Each of channel region 105 and 106 may comprise a single channel region (E.G. a fin type channel), or may comprise multiple sub-channels together functioning as a single channel (E.G nanosheet or nanowire channels).

The channel regions 105 and 106 may be "cut" by source/drain (SD) 107 and 108 respectively. In some embodiments, the SD regions such as 107a-c and 108a-c are vertically aligned. In some embodiments, the channel regions 105 and 106 may be formed as a long line, and may later be cut at the locations where SD region features are desired, and the SD regions may be grown in the resulting cuts. Thus, "channels" of channel region 105 and 106 refer to the channels of all such transistor devices laid out in a line and so processed. 3 SD regions on each level are shown, but many more may be present.

The channel regions 105 and 106 may also be in contact with gates, such as gate regions 109 and 110, respectively, between SD regions 107a and b, and 108a and b, respectively, of transistor devices 103. In some embodiments, the gate regions 109 and 110 may comprise a gate stack comprising one or more of an interface layer (not shown), a dipole engineering layer (not shown), a thin high-K dielectric layer (not shown), a capping layer (not shown), and one or more layers of bulk work-function metal (WFM) (also not shown).

The interface layer may comprise, but is not limited to, at least one of SiO, silicon dioxide (SiO2), and/or silicon oxynitride (SiON).

Regarding the dipole engineering layer, it may include one or more of $Lu_2O_3$, LuSiOx, $Y_2O_3$, YSiOx, $La_2O_3$, LaSiOx, BaO, BaSiOx, SrO, SrSiOx, $Al_2O_3$, AlSiOx, $TiO_2$, TiSiOx, $HfO_2$, HfSiOx, $ZrO_2$, ZrSiOx, $Ta_2O_5$, TaSiOx, ScO, ScSiOx, MgO, and MgSiOx, where Ox indicates an oxide with a varying stoichiometry. The atomic percentage of elements in the first dipole layer may also be varied. For example, the silicon content in a silicate layer may range from zero to not more than seventy atomic percent. The silicon content in the silicate may be used to tailor the shift in Vt. The material selected depends upon the sign of the voltage shift desired and the designated devices (i.e., nFETs or pFETs) being formed. If the component being fabricated is an nFET and Vt is desired to be shifted downwards (negatively) then in some embodiments, the dipole engineering layer may include one or more of $Lu_2O_3$, LuSiOx, $Y_2O_3$, YSiOx, $La_2O_3$, LaSiOx, BaO, BaSiOx, SrO, $SrSiO_x$, MgO, and MgSiOx. If the component being fabricated is an nFET and Vt is desired to be shifted upwards (positively) then the dipole engineering layer may include at least one of $Al_2O_3$, AlSiOx, $TiO_2$, TiSiOx, $HfO_2$, HfSiOx, $ZrO_2$, ZrSiOx, $Ta_2O_5$, TaSiOx, ScO, ScSiOx, MgO, and MgSiOx. If the component being fabricated is a pFET and Vt is desired to be shifted upwards (negatively), then the dipole engineering layer may include at least one of $Lu_2O_3$, LuSiOx, $Y_2O_3$, YSiOx, $La_2O_3$, LaSiOx, BaO, BaSiOx, SrO, SrSiOx. If the component being provided is a p-FET and Vt is desired to be shifted downwards (positively), then the dipole engineering layer may include one or more of $Al_2O_3$, AlSiOx, $TiO_2$, TiSiOx, $HfO_2$, HfSiOx, $ZrO_2$, ZrSiOx, $Ta_2O_5$, TaSiOx, ScO, ScSiOx, MgO, and MgSiOx. Other materials may be used in the dipole engineering layer to shift the voltage up or down in other embodiments. In some embodiments, the dipole engineering layer may be deposited as the un-oxidized compositions on the capping layer, and driven into/through the high-K dielectric layer and the capping layer, becoming at least partially oxidized in the process. This drive in may be accomplished via an anneal process. The dipole engineering layer may fine-tune the Vt of the transistor by providing dipoles at the boundary of the interfacial layer and the high-K dielectric layer.

The high-K dielectric layer may comprise, but is not limited to one or more metal oxide or metal silicate such as oxides of Hf, Al, Zr, La, Mg, Ba, Ti, Pb, or a combination thereof, having a dielectric constant value greater than 7. The capping layer may comprise, but is not limited to, a metal nitride, such as TiN. The work function metal may comprise but is not limited to, in the N-type case, one or more layers of TiAl, TiAlC, ZrAl, WAl, TaAl, and HfAl. Additionally, in the case of using a dipole engineering layer, the WFM may comprise polysilicon. In the P-type case, the work function metal may comprise, but is not limited to, one or more layers of Ni, Pd, Pt, Be, Ir, Te, Re, Ru, Rh, W, Mo, WN, RuN, MoN, TiN, TaN, WC, TaC, TiC, TiAlN, and TaAlN. Additionally, in the case of using a dipole engineering layer, the WFM may comprise polysilicon.

Thus, as used herein below, the term "work function metal layer" (WFM layer) is intended to encompass the dipole engineering layer, the capping layer, and the bulk work-function metal layers, which collectively impact the work-function expressed by this layer. As used herein below, the term "High-K dielectric layer" is meant to encompass both the interface layer and the High-K dielectric layer itself, which layer is meant to provide for a dielectric between a channel and the WFM layer.

Gate regions 109 and 110 may be in contact, for example, when a common gate structure is desired. Alternatively, there may be a dielectric layer 111 separating the gates to provide for electrical isolation. The SD regions 107a-c and 108a-c, and gate regions 109 and 110 may have external contacts for power and signals, not shown.

The channel regions 105 and 106 may also be cut by a dielectric 112. This dielectric 112 may extend from the bottom-most height of the bottom level (and into the substrate) to the topmost height of the top level. This dielectric may be placed in a region where a gate would normally be formed (E.G at a proper pitch spacing between adjacent SD regions), for example, between SD regions 107b and 107c, and between 108b and 108c. This dielectric 112 may provide for electrical and diffusion isolation between adjacent transistor devices 103 and 104 on a level.

Figure 2:
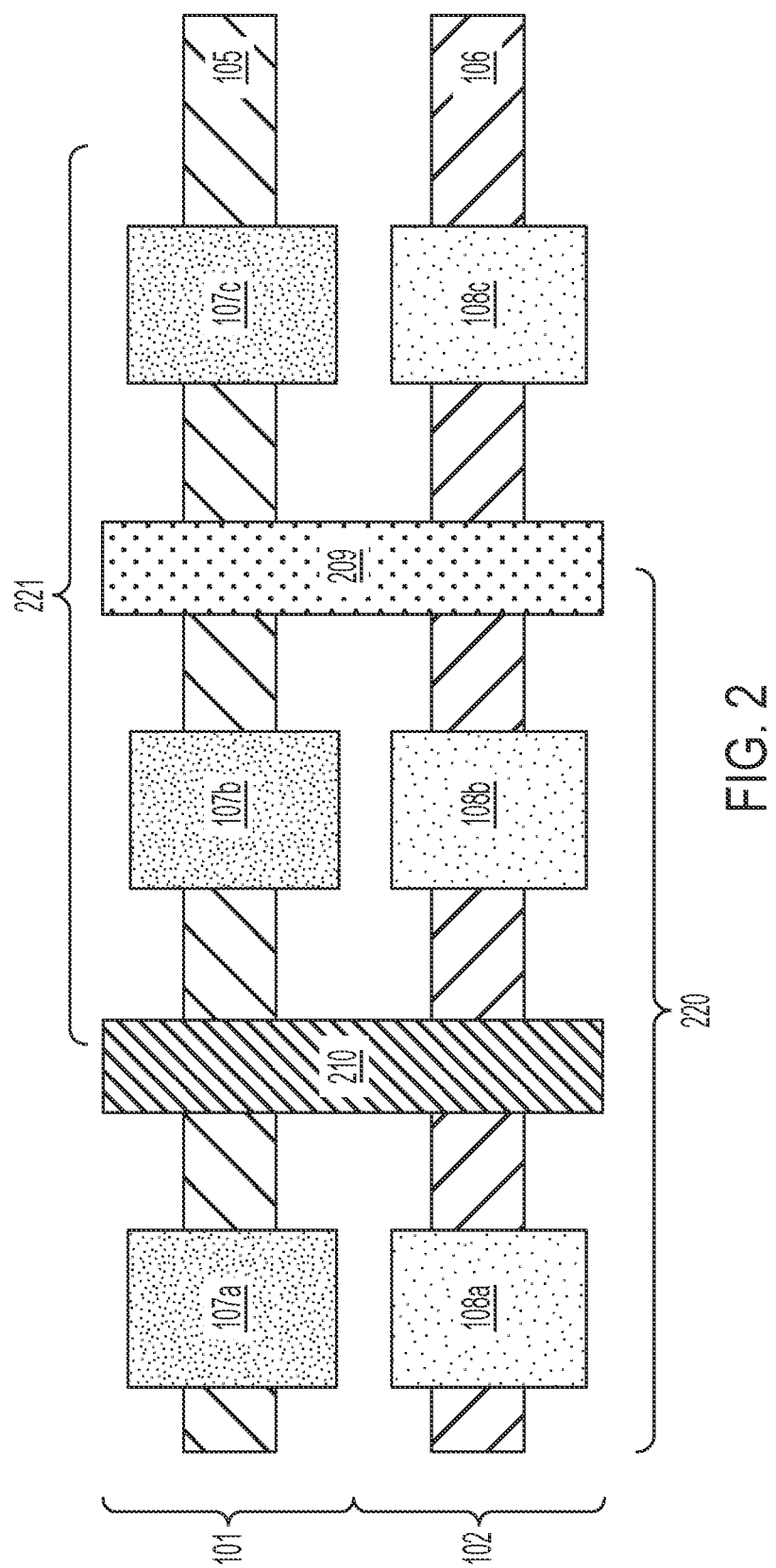
FIG. 2 provides for a stacked semiconductor device with hybrid gate/electrical breaks according to some embodiments.

FIG. 2 illustrates aspects of hybrid gate/electrical breaks according to some embodiments. FIG. 2 shares some similarities with FIG. 1, and similar parts share similar numbers. Parts having similar structure and function share numbers may not be re-described herein for brevity.

In the example embodiment of FIG. 2, it is desired that there be an active gate between SD regions 108a and 108b of level 102, and simultaneously that there be an electrical break between SD regions 107a and 107b of level 101. To accomplish this, hybrid gate/electrical break 210 is provided vertically between SD regions 107a and 107b, and between SD regions 108a and 108b. Recall that in these examples, channel region 106 is P type, and channel region 105 is N type. Hybrid gate/electrical break 210 comprises a p-work function metal layer, and contacts both channel regions 105 and 106. Thus, hybrid gate/electrical break 210 serves as a gate for channel region 106 between SD regions 108a and 108b, allowing for the creation of transistor device 220. Further, the p-work function metal layer serves as an electrical block for N-type channel region 105: substantially no charge carriers will move between SD regions 107a and 107b.

FIG. 2 also illustrates some embodiments of how to provide for a gate between SD regions 107b and 107c of level 101, while simultaneously providing for an electrical block between SD regions 108b and 108c of level 102, using hybrid gate/electrical break 209, provided vertically between SD regions 107b and 107c, and between SD regions 108b and 108c. Again recall that channel region 105 is N type and channel region 106 is P type in these examples. Hybrid gate/electrical break 209 contacts both channel regions 105 and 106, and comprises an n-work function metal layer. Thus, hybrid gate/electrical break 209 serves as a gate for the channel region 105 between SD regions 107b and 107c, allowing for the creation of transistor device 221. Further, n-work function metal layer serves as an electrical block for P-type channel region 106; substantially no charge carriers will move between SD regions 108b and 108c.

Thus, FIG. 2 illustrates that, when two device levels have opposite polarity, a work function metal layer in the gate of one level (and one polarity) can serve as an electrical break for the other level (having opposite polarity). More generally, a channel having a first polarity may be electrically broken by giving it a "false gate" comprising an opposite polarity work function metal layer.

Further note that this allows for an electrical break to exist in one level of a stacked transistor device without requiring that there be an electrical break vertically aligned either above or below it. That is, for example, hybrid gate/electrical break 210 allows there to be an electrical break along channel region 105 in the location of hybrid gate/electrical break 210, while simultaneously allowing for a gate to exist along channel region 106 vertically aligned directly below it, rather than requiring there also be an electrical break along 106, as in FIG. 1's dielectric 112.

Figure 3:
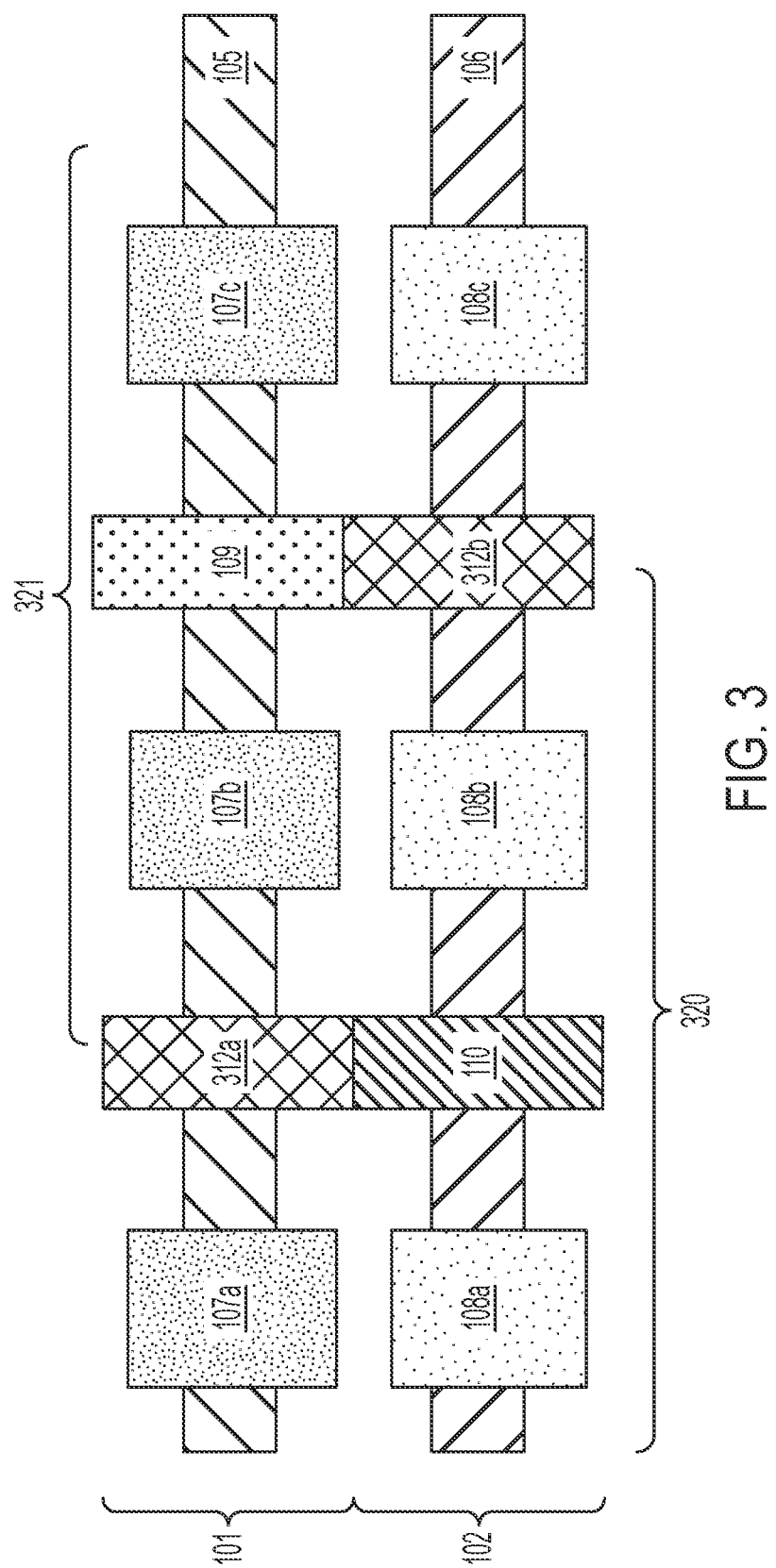
FIG. 3 provides for a stacked semiconductor device with level-selective diffusion breaks according to some embodiments.

FIG. 3 illustrates an example of level-selective single diffusion breaks according to some embodiments—that is, diffusion breaks that may be placed selectively on one level or another 101-102. FIG. 3 shares similarities to FIGS. 1 and 2, and like numbers represent like parts. For parts with the same functionality and number, descriptions will not be repeated for brevity.

For the example of FIG. 3, it is desired that there be an active gate between SD regions 108a and 108b of level 102, and simultaneously that there be an electrical and diffusion break between SD regions 107a and 107b of level 101. To accomplish this, a single diffusion break 312a comprising a dielectric is provided between SD regions 107a and 107b, while a gate region 110, which may comprise an p-work function metal layer is provided between SD regions 108a and 108b. This arrangement provides a gate region 110 for channel region 106 between SD regions 108a and 108b, allowing for the creation of transistor device 320. Further, the dielectric serves as an electrical and diffusion block for N-type channel region 105: substantially no charge carriers will move between SD regions 107a and 107b. It is noteworthy in this example, that the diffusion break 312a entirely cuts channel region 105. In other examples, the channel may instead be oxidized and surrounded with a dielectric, or simply surrounded by a dielectric. The dielectric may stretch vertically from the lowest height of the level 101 to the top of level 101.

Further in the example of FIG. 3, it is desired that there be an active gate between SD regions 107b and 107c of level 101, and simultaneously that there be an electrical and diffusion break between SD regions 108b and 108c of level 102. To accomplish this, a single diffusion break 312b comprising a dielectric is provided between SD regions 108b and 108c, while a gate region 109, which may comprise an n-work function metal layer is provided between SD regions 107b and 107c. This arrangement provides a gate region 109 for channel region 106 between SD regions 107b and 107c, allowing for the creation of transistor device 321. Further, the dielectric serves as an electrical and diffusion block for channel region 105: substantially no charge carriers will move between SD regions 108b and 108c. It is noteworthy in this example, that the diffusion break 312b entirely cuts channel region 106. In other examples, the channel may instead be oxidized and surrounded with a dielectric, or simply surrounded by a dielectric. The dielectric may stretch vertically from the lowest height of the level 102 to the top of level 102.

Further note that this allows for an electrical and diffusion break to exist in one level of a stacked transistor device without requiring that there be another electrical break vertically aligned either above or below it. That is, for example, the stack of single diffusion break 312a and gate region 110 allows there to be an electrical and diffusion break along channel region 105 in the location diffusion break dielectric 312, while simultaneously allowing for a gate to exist along channel region 106 vertically aligned directly below it, rather than requiring there also be a diffusion break along 106, as in FIG. 1's dielectric 112.

FIG. 4A-I provides for an example method for producing stacked gates which may comprise different work function metal layers, such as the stacked gate regions 109 and 110 of FIG. 1, according to an example embodiment. Alternatives for providing vertically stacked gate/diffusion break structures such as 312a/110 and 312b/109 of FIG. 3 are also discussed. FIGS. 4a-i are drawn so that they look down the length of the transistor channels; that is, current flows through the illustrated transistor components into or out of the page.

Turning to FIG. 4A, a first substrate 401 may be provided. Upon the first substrate 401, the active regions of the top transistor active region 402a, and bottom transistor active region 402b may be provided as a vertical stack (these may be portions of, E.G, the channel regions 105 and 106 of FIGS. 1-3). In some embodiments, the active regions may comprise a series of layers (generally not shown), for example, a series of nanosheets and sacrificial layers interleaved. In particular, bottom sacrificial layer 402b1 is highlighted for use later. Interleaved sacrificial layer 402b1 may be thicker than other sacrificial layers. A first isolation layer 403 may be provided between the active regions 402a and 402b to provide isolation between them.

In FIG. 4B, a dummy gate 404 may be provided upon the first substrate 401 such that it surrounds or wraps around the active regions 402a and 402b, and the first isolation layer 403. Outside of the dummy gate 404 may be an inter-layer dielectric material layer (ILD layer) 405, which may isolate the stacked semiconductor devices of the figure from other such devices. The dummy gate structure 404 may be formed by lithography and etching operations, and may include amorphous silicon, amorphous carbon, diamond-like carbon, dielectric metal oxide, and/or silicon nitride, not being limited thereto. The ILD layer 405 may be formed by chemical vapor deposition (CVD) or physical vapor deposition (PVD), not being limited thereto to include an oxide material in bulk (e.g., silicon dioxide having a low-κ dielectric).

Referring to FIG. 4C, an upper portion of the dummy gate structure 404 may be removed to about the vertical level of the center of the first isolation layer 403 to create a void and expose active region 402a. At this point, if active region 402b comprises nanosheets, any sacrificial layers within active region 402a may also be removed, with only active nanosheets remaining (not shown). These removals may be by, for example, a dry etching, a wet etching, a reactive ion etching (RIE) and/or a chemical oxide removal (COR) process. Shown in FIG. 4C bottom, an optional second isolation layer 407 may be deposited on top of the remaining dummy gate 404 material. This may be done where active regions 402a and 402b are not desired to have a common gate connection (in subsequent figures, this feature is omitted for simplicity, but may be present without modifying the scope of the disclosed concepts). In FIG. 4C top and bottom, the void may then be lined with a first high-K dielectric layer 406. More particularly, the first High-K dielectric layer 406 may contact the sides of ILD layer 405, the top of remaining dummy gate 404 or second isolation layer 407, portions of the first isolation layer 403, and wrap around the active region 402a (including any sub-channel regions). The High-K dielectric layer may be provided to allow an increased gate capacitance without associated current leakage at a gate structure to be formed later, and may comprise the materials listed previously.

Referring to FIG. 4D, the remaining void left in FIG. 4C. may be filled, wrapping around active region 402a (including sub-channels) with a first work function metal layer 408, creating a first gate region, such as a gate region 109 or 110 of FIG. 1 for active region 402a. This may be done by direct fill with a chosen work function metal layer, or may be done using a replacement gate process. For example, a polysilicon structure (not shown) may first be formed where the first WFM layer 408 is desired, to allow for annealing of the first high-K dielectric layer 406, and then may be removed, for example, by dry etching, wet etching, RIE and/or COR process, and replaced with desired first work function metal layer 408.

The choice of first work function metal layer 408 composition depends on the polarity of the active region 402a, and is discussed above. Further processing may be done to deposit additional ILD layer 405 above the level of first work function metal layer 408, and contact and metal structures 409 may be provided to allow for electrical and signaling contacts to the first work function metal layer 408. An additional substrate (not separately shown) may be bonded above the metal and contact layers 409 (or such additional substrate may include the metal layers and/or contacts and bond directly at the level of the first work function metal layer 408). This additional substrate may provide for structural and physical integrity for further processing.

Alternatively at FIGS. 4C and 4D, one may create a diffusion break such as diffusion break 312*a-b* of FIG. 3 for active region 402*a*, instead of a gate such as 109 or 110 of FIG. 1. To do this, the deposition of the first high-K dielectric layer 406 may be skipped in FIG. 4*c*, the exposed active region 402*a* may be oxidized or etched away, and the deposition of a first WFM layer 408 into the void of FIG. 4C may be replaced by a deposition of a dielectric material. This would create a diffusion break for active region 402*a*.

At FIG. 4E, the wafer may be flipped. That is, metal and contact layers 409 are now at the bottom, and first substrate 401 is at the top. At this point, first substrate 401 may be removed to expose the remainder of dummy gate 404 at the top, as well as the sacrificial layer 402*b*1 component of active layer 402*b*, and the ILD layer 405.

Figure 4I:
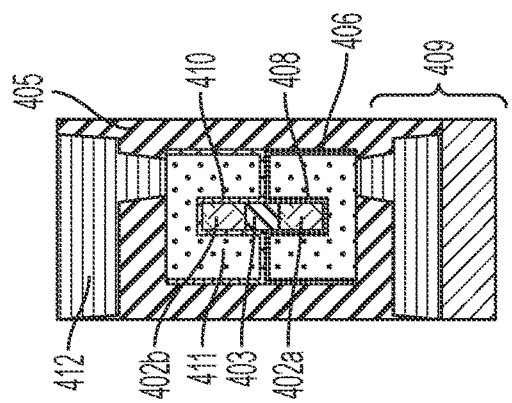
Figure 4H:
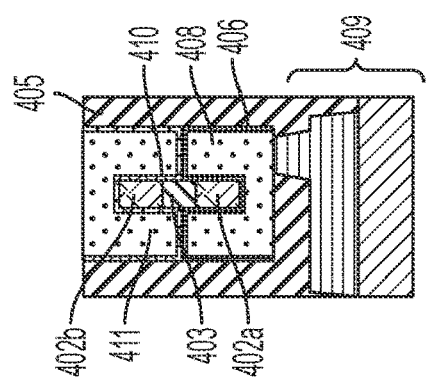
Figure 4G:
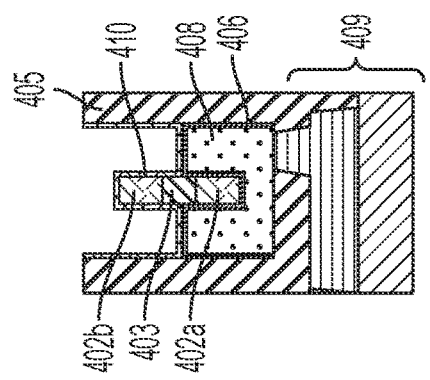
Figure 4F:
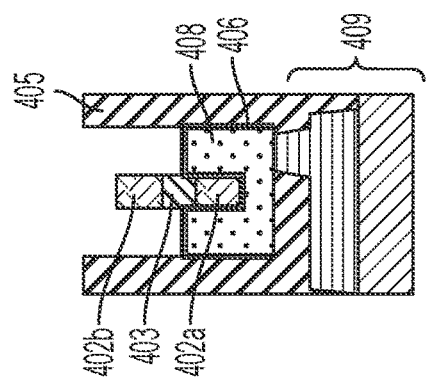

At FIG. 4F, the remaining dummy gate material 404 is removed, using a process similar to that of FIG. 4C, forming a void. Additionally, if active region 402*b* comprises nanosheets, the sacrificial layers may be removed, leaving the active nanosheet layers. Note especially that thick sacrificial layer 402*b*1 has also been removed, providing for an offset in height between the top of the ILD layers 405, and the top of the active layers 402*b*, with the top of 402*b* being lower than the top of ILD layer 405.

At FIG. 4G, a second high-K dielectric layer 410 is formed, lining the void of FIG. 4F—specifically, lining the sides of ILD layer 405, warping around the active region 402*b* (including sub-channels), contacting the first isolation layer 403, and the first high-K dielectric layer 406 or second isolation layer 407. The composition and process of formation for second high-K dielectric layer 410 is substantially similar to that of first high-K dielectric layer 406, and is not repeated here.

At FIG. 4H, a second work function metal layer 411 is deposited into the remaining void, wrapping around active region 402*b* (including sub-channels) of FIG. 4*c* to create a second gate region, such as the other of 109 or 110. The process is similar to that provided in FIG. 4*d*, and is not repeated here. As with FIG. 4*c*, the choice of second work function metal layer 411 composition depends on the polarity of the active region 402*b*, and is discussed elsewhere.

Alternatively at FIG. 4F, instead of progressing on to FIGS. 4*g* and 4*h* to preparing a gate such as 109 or 110 as discussed above, one may instead prepare a diffusion break 312*a* or 312*b* from FIG. 3. To do this, at FIG. 4F, the exposed active region 402*b* may be oxidized or etched away, the deposition of the second high-K dielectric layer 410 may be skipped, and the void may be filled with a dielectric material, instead of the second WFM layer 411. This would create a diffusion break for active region 402*b*

At FIG. 4I, additional ILD layer 405, and metal layers, and contacts (collectively 412) are provided for second work function metal 411 of the second gate region. This process is analogous to the process provided in FIG. 4*d*, and is not repeated here.

FIG. 5A-E provides for an alternative example method for producing stacked gates which may comprise different work function metal layer composition, such as the stacked gate regions 109 and 110 of FIG. 1. Alternatives presented to allow for vertically stacked gate/diffusion break structures such as 312*a*/110 and 312*b*/109 of FIG. 3

FIGS. 5A-E are drawn so that they look down the length of the transistor channels; that is, current flows through the illustrated transistor components into or out of the page.

FIGS. 5A and 5B share similarities with FIGS. 4A and 4B. The descriptions of similar components and processes are therefore not repeated.

In FIG. 5C, the dummy gate 404 is removed in its entirety, along with any sacrificial layers within active layers 402*a* and 402*b*, such as sacrificial layer 402*b*1, creating a void. A first high-K dielectric layer 501 may be deposited, such that it lines the sides of the void, including lining active regions 402*a-b* (including any sub-channels), and first isolation layer 403, as well as the sides of the ILD layer 405 and first substrate 401. First high-K dielectric layer 501 may comprise materials similar to first high-K dielectric 406, and may be deposited in a similar manner.

In FIG. 5D, a first WFM layer 502 is deposited into the bottom of the void created in FIG. 5C, up to the level of about the middle of first isolation layer 403, and surrounding active region 402*b* (including any sub-channels). This may be done by direct fill with a chosen work function metal layer composition, or may be done using a replacement gate process. For example, a polysilicon structure (not shown) may first be formed where the first WFM layer 502 is desired, to allow for annealing of the first high-k dielectric layer 501, and then may be removed, for example, by dry etching, wet etching, RIE and/or COR process, and replaced with desired first WFM layer 502. Thus, a first gate for the lower transistor comprising active region 402*b* is formed.

Additionally, optional second isolation layer 503 may be deposited above the first WFM layer 502. Second isolation layer 503 may comprise a similar material to, or a different material from, first isolation layer 403. Second isolation layer 503 may not be included when a common gate is desired for the stacked active regions 402*a* and *b*, or included when the gates of active regions 402*a* and 402*b* should be isolated.

Alternatively, if one wishes to form diffusion break such as diffusion break 312*a-b* for the active region 402*b*, instead of a gate, then, in FIGS. 5C and 5D, one may omit the deposition of the first high-K dielectric layer 501 and the first WFM layer 502, and instead deposit a dielectric material up to the level of the first isolation layer 403.

In FIG. 5E, a second WFM layer 504 is deposited above second isolation layer 503 (or first WFM layer 502), and filling the remainder of the void, wrapping around active region 402*a* (including any sub-channels). As described above, and similar to first WFM layer 502, this may be either through either direct fill, or a replacement gate technique. Thus, a gate for the upper transistor comprising active region 402*a* is formed.

Alternatively, if one wishes to form diffusion break such as diffusion break 312*a-b* for the active region 402*a*, instead of a gate, then, in FIG. 5*e*, one may omit the deposition of second WFM layer 504, and instead etch or oxidize the active region 402*a*, and deposit a dielectric to fill the remaining void.

As with FIG. 4, in FIG. 5 the choice of work function metal used for first WFM layer 502 and second WFM layer 504 is based on the polarity of the active regions 402*b* and 402*a*, respectively.

Figure 6D:
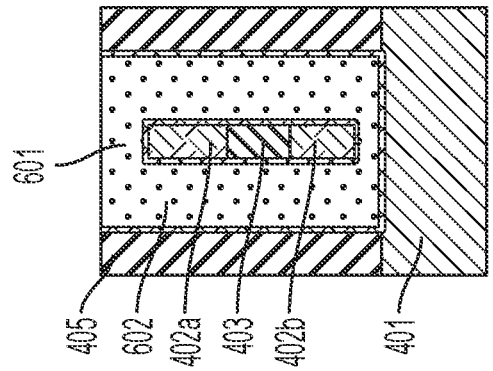
FIGS. 6A-6D illustrate a method for making a hybrid gate/electrical break structure according to some embodiments.
Figure 6C:
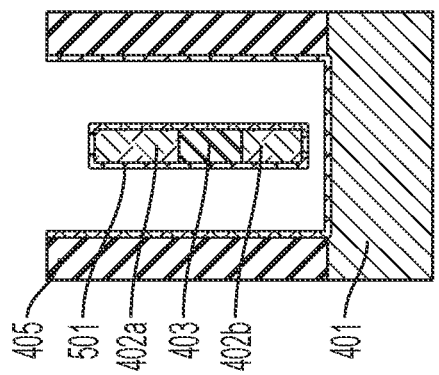
Figure 6B:
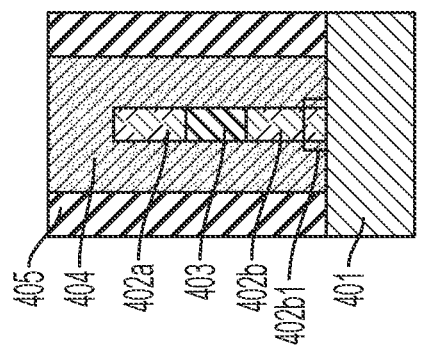
Figure 6A:
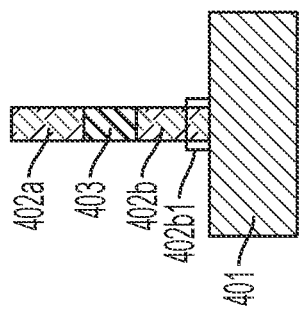

FIG. 6A-C provides for a process for creating a hybrid gate/electrical break similar to 209 or 210 of FIG. 2. Recall that hybrid gates/electrical breaks 209 and 210 comprise two stacked transistors (of opposite polarity) with a single gate comprised of a work function metal layer of a single polarity.

FIGS. 6A and 6B are substantially the same as FIGS. 4A and 4B, and FIGS. 5A and 5B, and the process of FIG. 6 below may be used alongside either process. The descriptions of similar components and processes are therefore not repeated. Recall that active regions 402a and 402b may have opposite polarities. However, when forming a hybrid gate/electrical break, instead of progressing onto the actions and structures of FIG. 4C-I, or FIG. 5C-E one may proceed to the processes and structures of FIGS. 6C and 6D.

In FIG. 6C, the dummy gate 404 is removed in its entirety, along with any sacrificial layers within active regions 402a and 402b, such as sacrificial layer 402b1, creating a void. A first high-K dielectric layer 601 may be deposited, such that it lines the sides of the void, including lining active regions 402a and 402b (including any sub-channels), and first isolation layer 403, as well as the sides of the ILD layer 405 and first substrate 401. First high-K dielectric layer 601 may comprise materials similar to first high-K dielectric layer 406, and may be deposited in a similar manner.

In FIG. 6D, a work function metal layer 602 is deposited into, and may fill, the void created in FIG. 6C, wrapping around active regions 402a and 402b (including any sub-channels) in order to create the hybrid gate/electrical break, such as 209 or 210 of FIG. 2. This may be done by direct fill with a chosen work function metal layer composition, or may be done using a replacement gate process. For example, a polysilicon structure (not shown) may first be formed where the WFM layer 602 is desired, to allow for annealing of the first high-K dielectric layer 601, and then may be removed, for example, by dry etching, wet etching, RIE and/or COR process, and replaced with desired WFM layer 602.

The choice of work function metal layer 602 composition is based on which of the active regions 402a and 402b one wishes to provide a gate for, or conversely, to provide an electrical break for, and their polarity. As discussed above, if one wishes to provide a gate for an NFET and an electrical break for a PFET, then an n-WFM layer may be used. However, if one wishes to provide a gate for a PFET and an electrical break for an NFET, then a p-WFM layer may be used.

Figure 7:
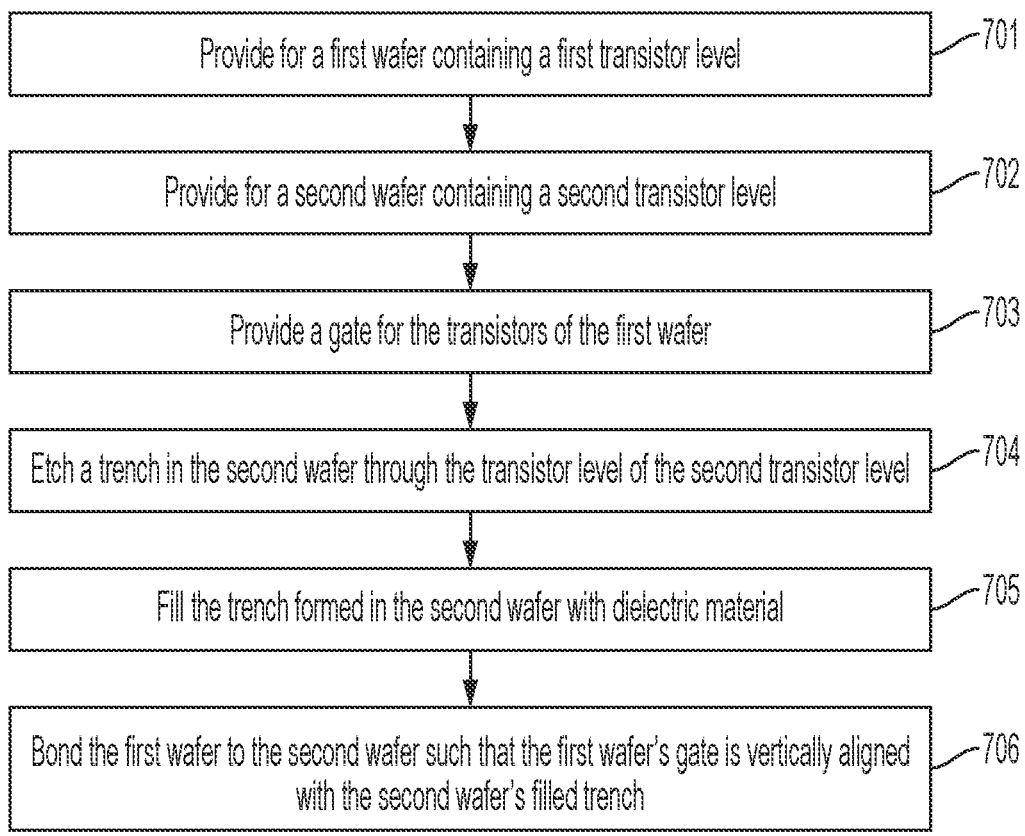
FIG. 7 provides for a flowchart for a method for providing level-selective electrical and diffusion breaks according to some embodiments.

FIG. 7 provides for a flowchart for an alternative method for providing a level-selective electrical and diffusion break in a stacked transistor device, according to some embodiments. At process 701, a first wafer comprising a first transistor level comprising a plurality of transistors is provided. At process 702, a second wafer comprising a second transistor level, comprising a plurality of transistors is provided. At process 703, a gate is provided for a transistor of the first level in the first wafer. At process 704, a trench is etched in the second wafer through the second transistor level. In some embodiments, this trench is at least through the channel of a transistor in the second level of the second wafer. At process 705, the trench formed in process 704 is filled with a dielectric material. At process 706, the two wafers are bonded such that the first wafer's gate is vertically aligned with the second wafer's filled trench.

Figure 8:
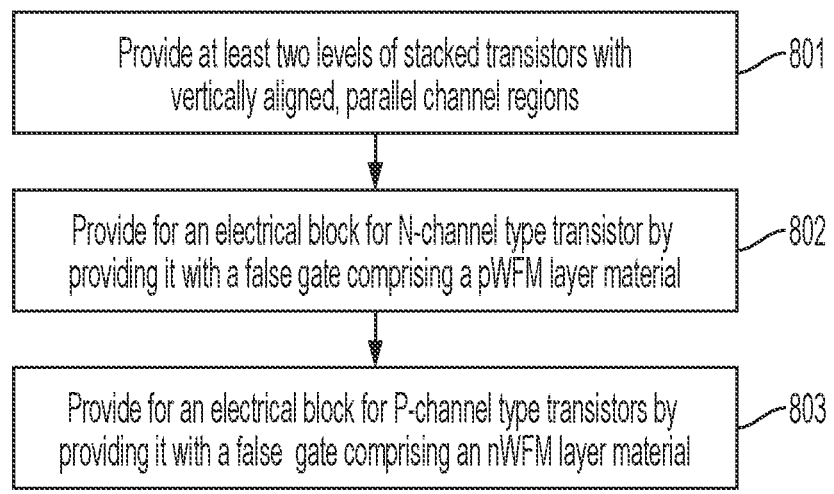
FIG. 8 provides for a flowchart for a method of forming electrical breaks according to some embodiments.

FIG. 8 provides a flowchart for an example method for providing for level-selective electrical breaks on stacked transistor devices, according to some embodiments. At process 801, two stacks of transistor devices with vertically aligned, parallel channel regions are provided. At process step 802, an electrical block for an N-type channel is provided by providing it with a "false gate" comprising a p-WFM layer composition. At process 803, an electrical break is provided for a P-type channel region by providing it with a "false gate" comprising an n-WFM layer composition.

Figure 9:
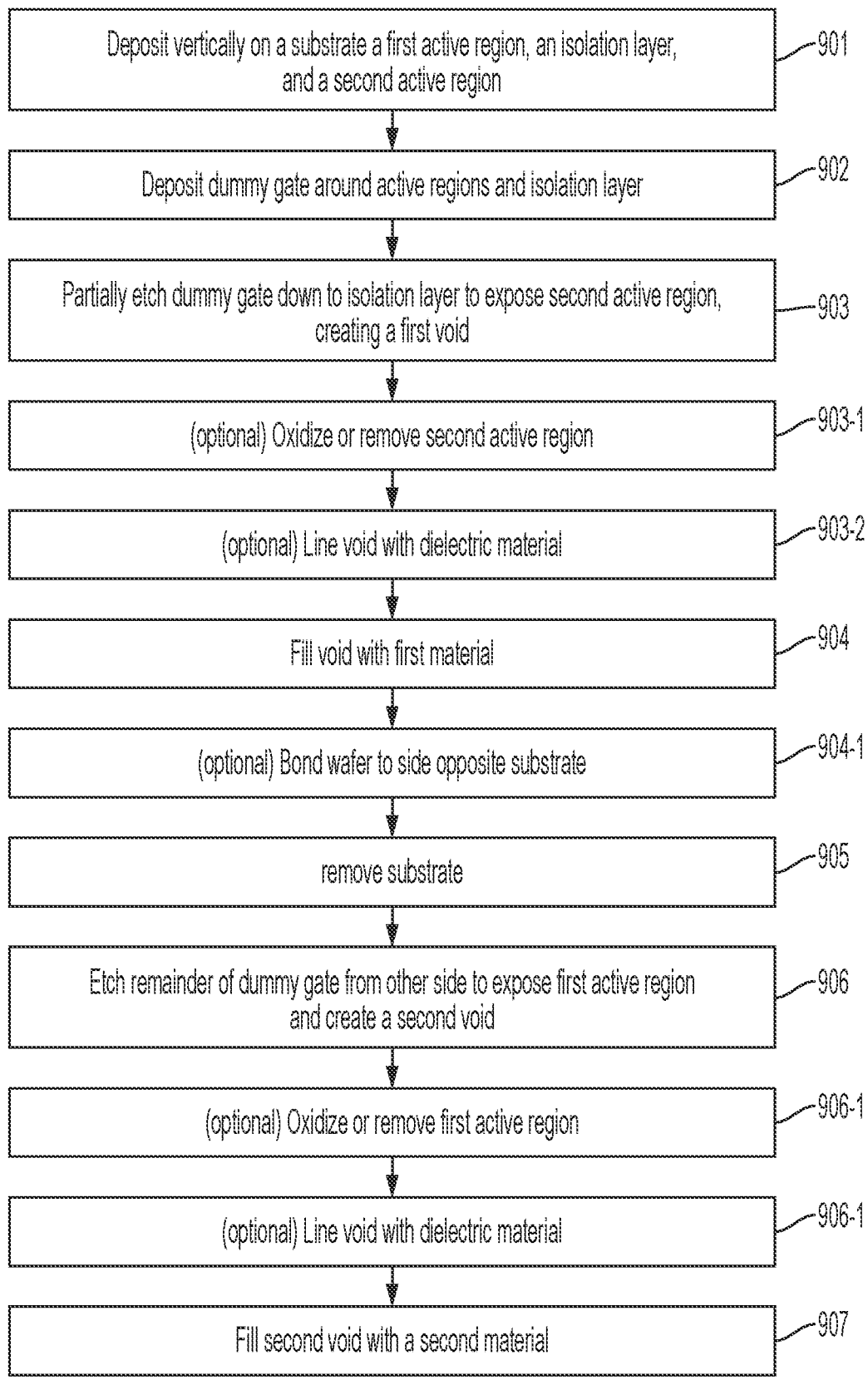
FIG. 9 provides for a flowchart for a method for forming level-selective electrical and diffusion breaks according to some embodiments.

Turning to FIG. 9, a flowchart for an example method of forming level-selective electrical and diffusion breaks, such as the process described in FIG. 4A-I is shown. At process 901, a substrate has deposited on it, in a vertical stack, a first active region, similar to active region 402a of FIG. 4A, an isolation layer, similar to isolation layer 403 of FIG. 4a, and a second active region, similar to active region 402b of FIG. 4A. The substrate defines a first and second surface, which are parallel to the substrate and reside at the top and bottom of the device, the substrate being taken as the bottom at this point. As with active regions 402a and 402b of FIG. 4, the first and second active regions herein may comprise sub-channels and sacrificial layers in some embodiments.

At process 902, a dummy gate is deposited around the first and second active regions and the isolation layer, similar to dummy gate 404 of FIG. 4B and formed via mechanisms and of materials discussed above.

At process 903 the dummy gate may be partially etched, down to the vertical level of about the middle of the isolation layer, exposing the second active region, as is also shown and discussed in FIG. 4C, and creating a first void. At optional process 903-1, the exposed active region may be oxidized or removed. This may be done if it desired to create an electrical and diffusion break at the level of the second active region. At optional process 903-2, the first void may be lined with a high-K dielectric layer, such as the first high-K dielectric layer 406 of FIG. 4C, the formation and composition of which is discussed more thoroughly above. This process 903-2 may be done, for example, if it is desired to create a gate for the second active region. At process 904, the first void may be filled with a first material. If it is desired to create an electrical and diffusion break at the level of the second active region, this first material may be a dielectric. If it is desired to create a gate at the level of the second active region, then the first material may be a work function metal layer composition, such as the first work-function metal layer 408 of FIG. 4C. The formation of these fills is discussed more thoroughly above. At optional process 904-1, a wafer or second substrate may be bonded to the surface of the device opposite the first substrate (that is, the top, at this time), as discussed above with regards to FIG. 4D.

At process 905, the wafer may be flipped, and the first substrate may be removed, as discussed above with regard to FIG. 4E.

At process 906, the remainder of the dummy gate may be removed from the other side (that is, it is now removed from the top, having been flipped), to expose the first active region and create a second void, as is further discussed above with regards to FIG. 4F. At optional process 906-1, the exposed first active region may be oxidized or removed. This may be done if it desired to create an electrical and diffusion break at the level of the first active region. At optional process 906-2, the second void may be lined with a high-K dielectric layer, such as discussed above with regard to similar second high-K dielectric layer 410 of FIG. 4G. This may be done, for example, if it is desired to create a gate for the first active region. At process 907, the second void may be filled with a second material. If it is desired to create an electrical and diffusion break at the level of the first active region, this second material may be a dielectric. If it is desired to create a gate at the level of the second active region, then the second material may be a work function metal layer composition, such as the second work-function metal layer 411 of FIG. 4H. The discussion of this fill is discussed more thoroughly above with regard to FIG. 4H.

Figure 10:
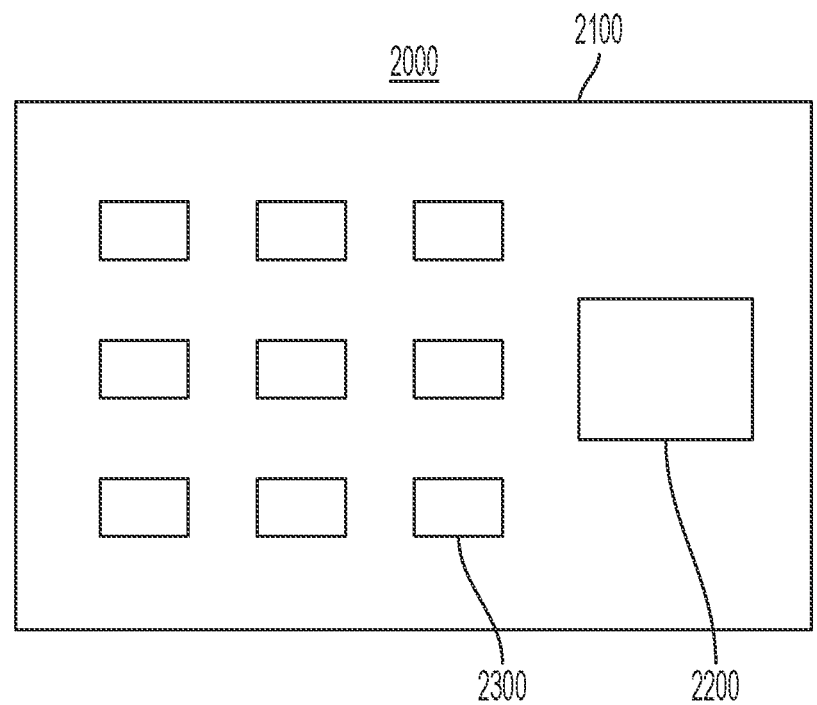
FIG. 10 illustrates a semiconductor package that may utilize the stacked transistor devices provided herein.

Referring to FIG. 10, a semiconductor package 2000 according to an example embodiment may include a processor 2200 and semiconductor devices 2300 that are mounted on a substrate 2100. The processor 2200 and/or the semiconductor devices 2300 may include one or more of the stacked semiconductor device architecture described in the above example embodiments.

Figure 11:
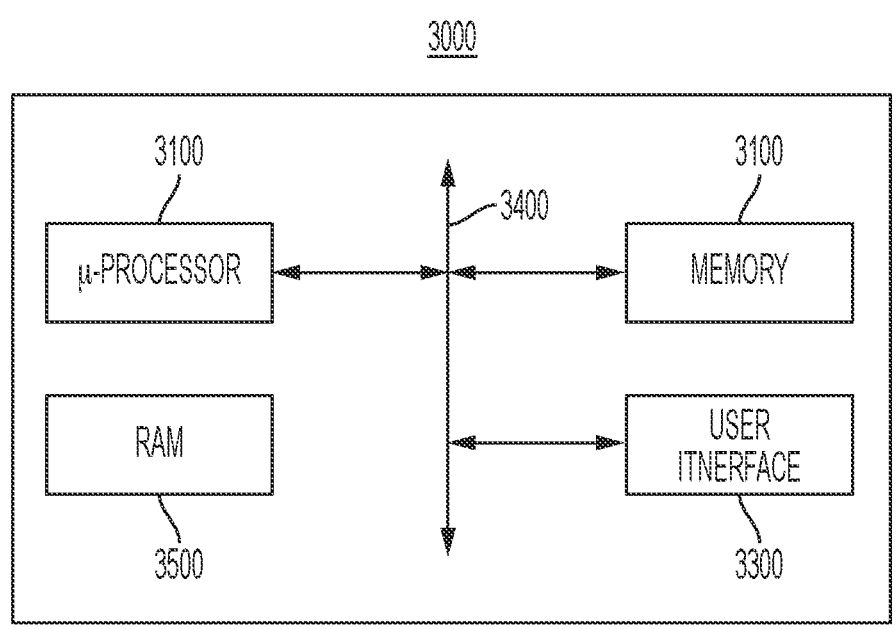
FIG. 11 illustrates a schematic block diagram of an electronic system according to an example embodiment.

FIG. 11 illustrates a schematic block diagram of an electronic system according to an example embodiment.

Referring to FIG. 11, an electronic system 3000 in accordance with an embodiment may include a microprocessor 3100, a memory 3200, and a user interface 3300 that perform data communication using a bus 3400. The microprocessor 3100 may include a central processing unit (CPU) or an application processor (AP). The electronic system 3000 may further include a random access memory (RAM) 3500 in direct communication with the microprocessor 3100. The microprocessor 3100 and/or the RAM 3500 may be implemented in a single module or package. The user interface 3300 may be used to input data to the electronic system 3000, or output data from the electronic system 3000. For example, the user interface 3300 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 3200 may store operational codes of the microprocessor 3100, data processed by the microprocessor 3100, or data received from an external device. The memory 3200 may include a memory controller, a hard disk, or a solid state drive (SSD).

At least the microprocessor 3100, the memory 3200 and/or the RAM 3500 in the electronic system 3000 may include stacked semiconductor device architecture as described in the above example embodiments.

It should be understood that example embodiments described herein should be considered in a descriptive sense only and not for purposes of limitation. Descriptions of features or aspects within each example embodiment should typically be considered as available for other similar features or aspects in other embodiments.

While example embodiments have been described with reference to the figures, it will be understood by those of ordinary skill in the art that various changes in form and details may be made therein without departing from the spirit and scope as defined by the following claims. Some example embodiments set forth herein include, but are not limited to the following statements:

Statement 1: A transistor device comprising at least two layers of transistors, wherein a first layer comprises 2 or more NFET transistor devices and a second, vertically aligned layer comprises 2 or more PFET transistor devices; wherein an electrical or diffusion break resides between two or more transistors of either the first or second layer, and a gate, vertically aligned with the electrical or diffusion break, resides between two or more source-drain regions of the other of the first or second layer.

Statement 2: The device of statement 1, wherein, Two adjacent PFET transistors are separated by an electrical break comprising a hybrid gate/electrical break between them, the hybrid gate/electrical break comprising an N-work function metal (nWFM) layer, the hybrid gate/electrical break also serving as a gate between two NFET SD regions.

Statement 3: The device of statement 1, wherein, Two adjacent NFET transistors are separated by an electrical break comprising a hybrid gate/electrical break between them, the hybrid gate/electrical break comprising an P-work function metal (pWFM) layer, the hybrid gate/electrical break also serving as a gate between two PFET SD regions.

Statement 4: The device of statement 1, wherein, Two adjacent transistor devices of a layer of the two or more layers are isolated by a dielectric between the two transistors of one layer of the two or more layers, and a gate region, vertically adjacent to the dielectric in the other layer, comprises a work function metal layer.

Statement 5: The device of statement 2, wherein the nWFM layer comprises one or more of: TiAl, TiAlC, ZrAl, WAl, TaAl, HfAl, La, Sr, Ba, Lu Y, and polysilicon.

Statement 6: The device of statement 5, wherein the nWFM layer comprises one or more of La, Sr, Ba, Lu, or Y, the La, Sr, Ba, Lu, or Y is at least partially oxidized, and the at least partially oxidized La, Sr, Ba, Lu, or Y serves in a dipole engineering layer.

Statement 7: The device of statement 3, wherein the pWFM layer comprises one or more of: Ni, Pd, Pt, Be, Ir, Te, Re, Ru, Rh, W, Mo, WN, RuN, MoN, TiN, TaN, WC, TaC, TiC, TiAlN, TaAlN, Al, Ta, Zr, Ti, Hf, Sc, and polysilicon.

Statement 8: The device of statement 7, wherein the pWFM layer comprises one or more of Al, Ta, Zr, Hf, Sc, or Ti, the Al, Ta, Zr, Hf, Sc, or Ti is at least partially oxidized, and the at least partially oxidized Al, Ta, Zr, Hf, Sc, or Ti serves in a dipole engineering layer.

Statement 9: A method for providing an electrical break for a channel having a first polarity, comprising: providing the channel with a false gate comprising a work function metal (WFM) layer of an opposite polarity.

Statement 10: The method of statement 9, wherein the channel is P type and the WFM layer is a nWFM layer.

Statement 11: The method of statement 10, wherein the nWFM layer comprises one or more of: TiAl, TiAlC, ZrAl, WAl, TaAl, HfAl, La, Sr, Ba, Lu, Y, and polysilicon.

Statement 12: The method of statement 11, wherein the nWFM layer comprises one or more of La, Sr, Ba, Lu, or Y, the La, Sr, Ba, Lu or Y is at least partially oxidized, and the at least partially oxidized La, Sr, Ba, Lu, or Y serves in a dipole engineering layer.

Statement 13: The method of statement 9, wherein the channel is N type and the WFM layer is a pWFM layer.

Statement 14: The method of statement 13, wherein the pWFM layer comprises one or more of: Ni, Pd, Pt, Be, Ir, Te, Re, Ru, Rh, W, Mo, WN, RuN, MoN, TiN, TaN, WC, TaC, TiC, TiAlN, TaAlN, Al, Ta, Zr, Ti, Hf, Sc, and polysilicon.

Statement 15: The method of statement 14, wherein the pWFM layer comprises one or more of Al, Ta, Zr, Hf, Sc, or Ti, the Al, Ta, Zr, Hf, Sc, or Ti is at least partially oxidized, and the at least partially oxidized Al, Ta, Zr, Hf, Sc, or Ti serves in a dipole engineering layer.

Statement 16: A method for providing a diffusion break in a level of a stacked semiconductor device having a first and second sides parallel to a first substrate, the method comprising:

Depositing vertically on the substrate a first active region, an isolation layer, and a second active region, Depositing around the first and second active regions and the isolation layer a dummy gate, Removing the a portion of the dummy gate from a first side to a vertical level of the isolation layer to create a first void, Depositing a first substance in the first void, Removing, from the second side of the stacked semiconductor device, the remaining portion of the dummy gate to create a second void, Depositing a second substance into the second void, Wherein one of the first or second substances comprises a dielectric material, and the other of the first or second substances comprises a work function metal layer.

Statement 17: The method of statement 16, additionally comprising oxidizing or removing one of the first or second active regions before depositing the first or second substance.

Statement 18: The method of statement 16, additionally comprising depositing a High-K dielectric around one of the first or second active regions before depositing the first or second substances.

Statement 19: The method of statement 16, additionally comprising bonding a second substrate to a side of the stacked semiconductor device opposite the first substrate, and removing the first substrate.

What is claimed is:

1. A transistor device comprising:
   at least two layers of transistors; and
   a hybrid gate/electrical break,
   wherein a first layer of the at least two layers comprises a plurality of active NFET transistor devices and wherein a second, vertically aligned layer, of the at least two layers comprises a plurality of active PFET transistor devices, and
   wherein the hybrid gate/electrical break is an electrical break between adjacent active transistor devices of either the first or second layer, and wherein the hybrid gate/electrical break is a gate between source and drain regions of an active transistor device in the other of the first or second layer.

2. The device of claim 1, wherein
   the hybrid gate/electrical break comprises an N-work function metal (nWFM) layer, wherein the hybrid gate/electrical break is an electrical break between two adjacent active PFET transistor devices in the second layer, and wherein the hybrid gate/electrical break is the gate between the source and drain regions of an active NFET transistor device in the first layer.

3. The device of claim 2, wherein the nWFM layer comprises one or more of: TiAl, TiAlC, ZrAl, WAl, TaAl, HfAl, La, Sr, Ba, Lu, Y, and polysilicon.

4. The device of claim 3, wherein the nWFM layer comprises one or more of La, Sr, Ba, Lu, or Y, the La, Sr, Ba, Lu, or Y is at least partially oxidized, and the at least partially oxidized La, Sr, Ba, Lu, or Y serves in a dipole engineering layer.

5. The device of claim 1, wherein
   the hybrid gate/electrical break comprises a P-work function metal (pWFM) layer, wherein the hybrid gate/electrical break is an electrical break between two adjacent active NFET transistor devices in the first layer, and wherein the hybrid gate/electrical break is the gate between the source and drain regions of an active PFET transistor device in the second layer.

6. The device of claim 5, wherein the pWFM layer comprises one or more of: Ni, Pd, Pt, Be, Ir, Te, Re, Ru, Rh, W, Mo, WN, RuN, MON, TIN, TaN, WC, TaC, TiC, TiAlN, TaAlN, Al, Ta, Zr, Ti, Hf, Sc, and polysilicon.

7. The device of claim 6, wherein the pWFM layer comprises one or more of Al, Ta, Zr, Hf, Sc, or Ti, the Al, Ta, Zr, Hf, Sc, or Ti that is at least partially oxidized, and the at least partially oxidized Al, Ta, Zr, Hf, Sc, or Ti serves in a dipole engineering layer.

8. The device of claim 1, wherein,
   two adjacent transistor devices of a layer of the at least two layers are isolated by a dielectric between two transistors of one layer of the at least two layers, and a gate region, vertically adjacent to the dielectric in the other layer, comprises a work function metal layer.

* * * * *